(12) United States Patent
Liu et al.

(10) Patent No.: US 11,456,523 B2
(45) Date of Patent: Sep. 27, 2022

(54) RADIO-FREQUENCY THREE-DIMENSIONAL ELECTRONIC-PHOTONIC INTEGRATED CIRCUIT WITH INTEGRATED ANTENNAS AND TRANSCEIVERS

(71) Applicant: Telefonaktiebolaget LM Ericsson (publ), Stockholm (SE)

(72) Inventors: Neng Liu, Montreal (CA); Robert Brunner, Montreal (CA); Stephane Lessard, Mirabel (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 256 days.

(21) Appl. No.: 16/639,345

(22) PCT Filed: Aug. 18, 2017

(86) PCT No.: PCT/IB2017/055023
§ 371 (c)(1),
(2) Date: Feb. 14, 2020

(87) PCT Pub. No.: WO2019/034919
PCT Pub. Date: Feb. 21, 2019

(65) Prior Publication Data
US 2021/0028534 A1    Jan. 28, 2021

(51) Int. Cl.
*H01Q 1/22* (2006.01)
*G02B 6/43* (2006.01)
(Continued)

(52) U.S. Cl.
CPC ............ *H01Q 1/2283* (2013.01); *G02B 6/43* (2013.01); *H01L 23/481* (2013.01); *H01L 23/66* (2013.01);
(Continued)

(58) Field of Classification Search
CPC .............. H01Q 1/2283; H01Q 3/2676; H01Q 21/0093; G02B 6/43; H01L 23/481;
(Continued)

(56) References Cited

U.S. PATENT DOCUMENTS 5,977,911 A    11/1999  Green et al.
7,146,069 B1   12/2006  Bowers et al.
(Continued)

OTHER PUBLICATIONS

Vinod, Pangracious, "Three-Dimensional Integration: A More Than Moore Technology", Springer International Publishing, 2015, pp. 13-41.
(Continued)

*Primary Examiner* — Seung H Lee
(74) *Attorney, Agent, or Firm* — Murphy, Bilak & Homiller, PLLC

(57) ABSTRACT

A radio-frequency three-dimensional electronic-photonic integrated circuit (RF 3D EPIC) comprises a radio-frequency (RF) photonic integrated circuit (PIC) layer, the RF PIC layer comprising, in a single integrated circuit, at least one RF antenna and at least one photonic device coupling the RF antenna to an optical interface, and further comprises an electronic-photonic integrated circuit (EPIC) assembly optically coupled to the optical interface of the RF PIC layer, the EPIC assembly comprising two or more integrated-circuit dies bonded to one another so as to form a die stack, wherein at least one of the two or more integrated-circuit dies comprises one or more integrated photonic devices and wherein each of the two or more integrated-circuit dies is electrically connected to at least one other integrated-circuit die via an electrically conductive through-wafer interconnect or an electrically conductive through-wafer via.

14 Claims, 6 Drawing Sheets

(51) Int. Cl.
*H01L 23/48* (2006.01)
*H01L 23/66* (2006.01)
*H01L 25/16* (2006.01)
*G02F 1/015* (2006.01)

(52) U.S. Cl.
CPC ............ *H01L 25/167* (2013.01); *G02F 1/015* (2013.01); *G02F 1/0157* (2021.01); *H01L 2223/6616* (2013.01); *H01L 2223/6677* (2013.01)

(58) Field of Classification Search
CPC .............. H01L 23/66; H01L 25/167; H01L 2223/6616; H01L 2223/6677; H01L 2223/6694; H01L 25/18; G02F 1/015; G02F 1/0157; H04Q 11/00; H05K 1/0274
See application file for complete search history.

(56) References Cited

U.S. PATENT DOCUMENTS

| | | | | |
|---|---|---|---|---|
| 9,678,369 | B2 * | 6/2017 | Bach | G02F 1/015 |
| 9,749,054 | B2 * | 8/2017 | Ben Ezra | H04B 10/40 |
| 2004/0091719 | A1 | 5/2004 | Uchida | |
| 2017/0192172 | A1 | 7/2017 | Babakhani et al. | |

OTHER PUBLICATIONS

Binh, Le, "Radio-over-Optical Waveguide System-on-Wafer For Massive Delivery Capacity 5G MIMO Access Networks", Proceedings Optical Diagnostics of Living Cells II. vol. 10128, Jan. 28, 2017, 1-10.

Brown, Elliott R, et al., "RF-MEMS Switches for Reconfigurable Integrated Circuits", IEEE Transactions on Microwave Theory and Techniques, vol. 46, No. 11, Nov. 1998, 1868-1880.

Cao, Zizheng, "Advanced Integration Techniques on Broadband Millimeter-Wave Beam Steering for 5G Wireless Networks and Beyond", IEEE Journal of Quantum Electronics, vol. 52, No. 1, Jan. 1, 2016, 1-20.

Carpintero, Guillermo, et al., "Photonic Integrated Circuits for Radio-Frequency Signal Generation", Journal of Lightwave Technology, vol. 34, No. 2, Jan. 15, 2016, 508-515.

Cheema, Hammad, et al., "The Last Barrier", IEEE Microwave Magazine, Jan./Feb. 2013, 79-91.

Dionne, Jennifer, et al., "PlasMOStor: A Metal-Oxide-Si Field Effect Plasmonic Modulator", American Chemical Society, Nano Letters, vol. 9, No. 2, Jan. 26, 2009, 897-902.

Habibpour, et al., "Wafer scale millimeter-wave integrated circuits based on epitaxial graphene in high data rate communication", Scientific Reports, Feb. 1, 2017, 1-8.

Pavuluri, Sumanth Kumar, et al., "High Efficiency Wideband Aperture-Coupled Stacked Patch Antennas Assembled Using Millimeter Thick Micromachined Polymer Structures", IEEE Transactions on Antennas and Propagation, vol. 58, No. 11, Nov. 2010, 3616-3621.

Seeds, Alwyn, et al., "Microwave Photonics: Present Status and Future Outlook", 2015, 1-6.

Zhang, et al., "Antenna-on-Chip and Antenna-in-Package Solutions to Highly Integrated Millimeter-Wave Devices for Wireless Communications", IEEE Transactions on Antennas and Propagation, vol. 57, No. 10, Oct. 2009, 2830-2841.

Ryu, Chunghyun, et al., "High Frequency Electrical Model of Through Wafer Via for 3-D Stacked Chip Packaging", Sep. 2006, pp. 215-220.

Yong-Duck, Chung, et al., "Development of SoP Transceiver for 60-GHz Pico-Cell Communications", Sep. 2008, pp. 150-153.

* cited by examiner

RADIO-FREQUENCY THREE-DIMENSIONAL ELECTRONIC-PHOTONIC INTEGRATED CIRCUIT WITH INTEGRATED ANTENNAS AND TRANSCEIVERS

TECHNICAL FIELD

The present disclosure is generally related to three-dimensional packaging of integrated circuits (ICs), and is more particularly related to three-dimensional integrated photonic-electronic IC assemblies.

BACKGROUND

Today's data centers typically comprise numerous server racks, each with many pluggable boards that together carry large numbers of core memories and processors. These boards are connected to one another by electrical or optical cables, which can limit the communication bandwidth between high-speed processors and memory. To address these issues in high-performance data centers, vertically stacked, three-dimensional (3D), packaging of these chips has been demonstrated to be a good solution which can reduce the interconnect path and interconnect delay to/from the memory layer. Therefore, several 3D electronic and 3D photonic systems have been developed, over the past decade.

One key issue slowing the trend toward ever-faster and denser storage and processing solutions is the delays caused by electronic circuit interconnects. These delays are due to the increasing number of interconnects, with more resistive, thinner, wires and increased wire-to-wire capacitance arising from the closer spacing between the interconnects. One approach to reducing these delays is to vertically stack electronic circuits in three dimensions, as compared to traditional integrated circuits and multi-chip modules (MCMs) that utilize design layouts in two dimensions (2D). The results of this vertical stacking may be referred to as a "3D Electronic Integrated Circuit" (3D EIC), an example of which is illustrated in FIG. 1.

As seen in FIG. 1, IC dies carrying different functions of a chip-level circuit, such as a memory layer, a processor layer, and an analog layer, can be stacked vertically, on a substrate, to create a heterogeneous integration of electronic ICs. As shown in the figure, the layers (i.e., the individual IC dies) are interconnected by through-silicon vias (TSVs) or micro-bumps. The 3D-EIC approach not only increases the density and performance of the electronic circuit, but also reduces the length of interconnects, which in turn reduces wire delays and power losses. 3D-EICs are described in Pangracious, V., Z. Marrakchi, and H. Mehrez, *Three-Dimensional Integration: A More Than Moore Technology*, in *Three-Dimensional Design Methodologies for Tree-based FPGA Architecture*. 2015, Springer International Publishing: Cham. p. 13-41.

Radio-frequency (RF) wireless communications has been demonstrated to be an efficient and practical method for connectivity, especially with regards to the evolution of the "Internet of Things" (IoT), where hundreds of billions of devices are expected to be networked. There is an insatiable need for higher-speed (≥10 Gb/s) wireless data communications, and higher resolution wireless active and passive imaging, which will lead to more electrical utilities being developed in support of an IoT world. To mitigate some of the potential consequences, carbon dioxide production, power consumption, and cost could be greatly reduced if lower-power wireless chip-to-chip communications were to replace electrical connectivity in commercial and industrial computing equipment (e.g., adjacent rack servers, ultra-wide-band cellular access points, wireless X-haul transponders, & wireless modular home computing such as wireless 8K TV, wireless storage/memory, wireless System on Chip (SoC), etc.). An energy-efficient solution based on the generation of high-frequency RF with high data transmission speed is challenging in the electrical domain, but RF photonics has the potential to resolve some of the key energy issues. However, there are still problems which need to be solved to meet the demands of fifth-generation (5G) applications.

Emerging wireless communication requires the evolution of the RF devices in miniaturization, portability, cost, and performance. To obtain enough gain, the standard metal antenna requires a surface area in the order of ten millimeters squared. Therefore, most of the 2D or 3D antennas integrated with RF Transceiver systems are currently fabricated on the package.

Recently, integrated full-duplex RF circuits, including RF transmitter and RF receiver circuits, on a semiconductor substrate have been of interest. These full duplex integrated circuits have been developed on gallium arsenide (GaAs) and silicon germanium (SiGe) substrates at a reasonable gain at 60 GHz. Compared with GaAs, SiGe is less expensive and compatible with standard complementary metal oxide semiconductor (CMOS) technology. The active components in the RF electronic circuits system, like oscillator, mixers and amplifiers have been integrated in chipsets at a lower cost. In an integrated RF Transceiver circuit, the integration of antennas plays a key role. The last barrier in an integrated RF electrical circuit is the antenna complex, whereby, an antenna on-chip (AOC) has been developed on silicon substrate with gain up to −19 dBi at 60 GHz in the footprint of a square millimeter or submillimeter. (See Cheema, H. M. and A. Shamim, *The last barrier: on-chip antennas*, IEEE Microwave Magazine, 2013. 14(1): p. 79-91.) By stacking multichip metal layers in a vertical fashion with artificial magnetic conductor (AMC), an AOC has been fabricated with a reported 9 dB gain improvement.

Another trend of miniaturization of AOC is the nano-antenna or nano-antenna arrays, as in graphene antennas. (Ibid.) Continuous improvement of the AOC radiation by using exotic techniques such as proton implementation and micromachining is available from mainstream silicon technology. (See Zhang, Y. P. and D. Liu, *Antenna-on-Chip and Antenna-in-Package Solutions to Highly Integrated Millimeter-Wave Devices for Wireless Communications*. IEEE Transactions on Antennas and Propagation, 2009. 57(10): p. 2830-2841.)

Nevertheless, with increasingly electrical integration from RF circuits in the same chip, the heat dissipation problem from these electrical interconnections becomes more serious.

RF photonics (Radio frequency photonics) refers to any combination of the detection, distribution, processing, frequency translation and switching of optical signals having modulation bandwidths in the RF, microwave, and millimeter wave frequency regions. It includes modulating light at RF frequency, transmitting that light through optical components and then converting the modulated light signal back to the RF domain. RF photonics can provide these high performances in an integrated system with more compact size and lower power than traditional RF electronic systems.

Various integrated RF photonic systems have been developed on a semiconductor substrate. An antenna-coupled Mach-Zehnder electro-absorption modulator (EAM) has been used to receive RF signal and modulate the light transmitting in a silicon waveguide. A III-V material integrated chip has been developed to generate millimeter wave between 5 GHz and 110 GHz by heterodyning two lasers. (See Seeds, A., et al. *Microwave photonics: present status and future outlook (plenary paper). in Microwave Photonics (MWP), 2015 International Topical Meeting on.* 2015. *IEEE.*) With advancement in photonic integrated circuits (PICs), the full function of receiving, transmitting, filtering, or even optical-electrical-optical conversion can be realized by monolithic integration of active and passive components within a scale of a millimeter on a silicon base.

However, currently most RF PICs are still being developed in two dimensional (2D) planar systems. The metal planar antennas used in an RF PIC system limit the integration circuit size beyond the chip scale. Most RF PICs are electrically or optically interconnected with external data processing module circuits. All these problems limit the compactness and increase the power loss for the RF PIC integrated full duplex system.

SUMMARY

Three-dimensional electron-photonic integrated circuit (3D EPIC) chips have been developed, but typically communicate with each other and with external environments using optical/electrical connections, which increase system complexity and cost. Further, there is limited research with regards to RF-integrated 3D-EPICs to provide a path for future wireless communications. Disclosed herein are RF 3D EPIC chips, which are 3D EPIC chips with the added functionality of antennas and RF transceiver circuitry, which in some cases are interconnected via an optical cross-connect (OXC) switch.

Embodiments disclosed herein include circuit assemblies that include a radio-frequency three-dimensional electronic-photonic integrated circuit (RF 3D EPIC), which comprises a radio-frequency (RF) photonic integrated circuit (PIC) layer, the RF PIC layer comprising, in a single integrated circuit, at least one RF antenna and at least one photonic device coupling the RF antenna to an optical interface, and which further comprises an electronic-photonic integrated circuit (EPIC) assembly optically coupled to the optical interface of the RF PIC layer, the EPIC assembly comprising two or more integrated-circuit dies bonded to one another so as to form a die stack, wherein at least one of the two or more integrated-circuit dies comprises one or more integrated photonic devices and wherein each of the two or more integrated-circuit dies is electrically connected to at least one other integrated-circuit die via an electrically conductive through-wafer interconnect or an electrically conductive through-wafer via.

DETAILED DESCRIPTION

Figure 1:
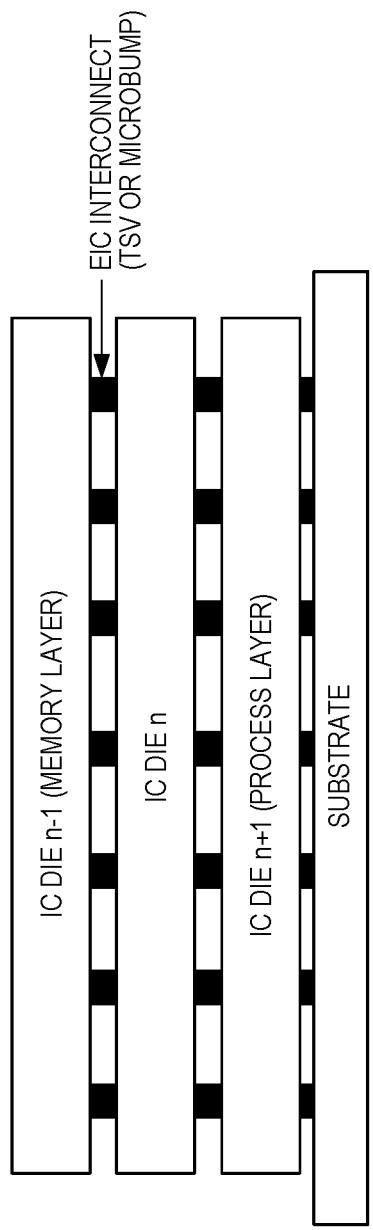
FIG. 1 illustrates an example 3D electronic integrated circuit (EIC).

Three-dimensional (3D) integrated circuits (IC) have greatly extended the performance of two-dimensional (2D) ICs by incorporating multiple device layers, such as memory and processor layers, with vertical interconnections between them. With a tiny footprint, low power consumption, exceptional speed, circuit security and several other advantages, the 3D IC has been aggressively pursued in both academia and the industrial field. With the development of vertical interconnections like electrical through-silicon vias (TSVs), optical TSVs, vertical waveguides, and so on, the 3D electronic-photonic IC (EPIC)—the integration of both electronic and photonic circuits in a chip scale—has been proposed. The EPIC is expected to be more cost effective, reliable, and highly integrated, which can solve communication problems in future data centers that are not solvable by electronics or photonics alone. On-chip photonic interconnections in 3D-EPIC can overcome limitations of electronic integrated circuits (EIC), by providing low power consumption, low cross talk, and high bandwidth. The 3D-EPIC based on silicon substrate has been most investigated to date, as it is highly compatible with complementary metal-oxide semiconductor (CMOS) wafers. Advanced cooling systems have been developed for 3D ICs which can be adapted to solve the thermal problems of the 3D-EPIC.

However, most of these 3D-EPIC chips communicate with each other and with external environments using optical/electrical connections, which increase system complexity and cost. Currently, there is limited research with regards to RF-integrated 3D-EPICs to provide a path for future wireless communications.

A problem with recent RF Transceiver integrated systems is that they lack chip-scale integration of AOC, RF receiving and transmitting circuits, and data processing circuits. These systems have low compactness, but demand higher power and heat accumulation. Furthermore, a complete "System on Chip" (SoC) with integrated RF Transceivers that can support ultra-wide-band communications in the millimeter or sub-millimeter wavelength band, with bandwidths approaching a Terahertz (THz) have not previously been developed.

Disclosed herein and described in detail below are RF 3D EPIC chips, which are 3D EPIC chips with the added functionality of antennas and RF transceiver circuitry, which in some cases are interconnected via an "Optical Cross-connect" (OXC) switch, thus exploiting optical RF (0-RE) signaling.

In an RF 3D EPIC chip, electrical RF signals (GHz ingress/egress communications) are frequency up-converted into the optical domain, e.g., to about 193 THz, where "optical RE" (O-RE) signals are easily propagated via optical waveguides/fibers great distances, without introducing electromagnetic interference (EMI) into a system. Egress O-RE signals when directed towards an antenna by the OXC switch are frequency down-converted into an electrical RF signal, which is suitable for the propagation of radio waves. The ingress O-RE signals when directed towards the receiver processor by the OXC switch are frequency down-converted to an electrical RF signal, and possibly electrically down-converted to a lower frequency, such as an intermediate frequency (IF) that is in the range of the sampling speed of the analogue-to-digital converter (ADC)/digital signal processing (DSP) receiver function for direct baseband signal recovery (i.e., demodulation).

In further detail, antennas are coupled to RF PICs that are directly stacked on top of the RF 3D EPIC chips based on silicon wafer bonding or direct growth. The RF PIC is designed for optical-electrical-optical conversion and the optical RF analog signals are processed in the RF 3D EPIC. For energy efficiency & RF EMI isolation reasons, the RF PIC communicates with the lower levels of the RF 3D EPIC stack using vertical optical waveguides, e.g., optical TSVs. Advanced AOC techniques, like 3D stacked antennas, can be used to obtain high gain compact antenna arrays.

In some embodiments, the antenna arrays are located remotely, either on the same or separate substrate, and are optically coupled by waveguides (e.g., multi-core optical fiber, polymer channels in the substrate) to the RF 3D EPIC chip.

Further, the O-RE uplinks and downlinks can share the same antenna arrays, by means of an RF OXC switch layer embedded in the chip.

Various embodiments described herein may provide one or several of the following benefits:

- RF 3D EPIC chips, which entail the stacking of an RF PIC layer on a 3D EPIC, can be used to enable wireless chip-to-chip communications in computing equipment such as in wireless: SoC, storage/memory, displays, adjacent rack servers, ultra-wide-band cellular access points, X-haul transponders, etc.
- Optical cross-connects of transceivers to antennas within a RF 3D EPIC reduces EMI, by eliminating electrical signal routing paths, and enables the scalability of high-gain RF antenna arrays (e.g., 1024×1024 @ 80 dBi), supporting advanced beam forming.
- Optical cross-connects of transceivers to antennas within an RF 3D EPIC improves EMI isolation by permitting placement of radiating antennas anywhere on the chip that is most suitable for shielding, without being concerned about optical signal reach or electrical crosstalk.
- In RF 3D EPICs, the signal processing can be placed directly below the RF PIC layer improving compactness and power consumption, while being optically isolated. In general, all digital & mixed-analog circuitry can be optically isolated, improving EMI within the chip/multi-chip module/multi-chip-carrier.
- A RF PIC layer integrated to a 3D-EPIC is compatible with CMOS and standard foundry micro/nanofabrication, but also with hybrid graphene, III-V or organic materials back-end processes.
- Direct integration of an RF PIC layer on a 3D-EPIC can leverage already developed 3D IC packaging and cooling solutions.

Figure 2:
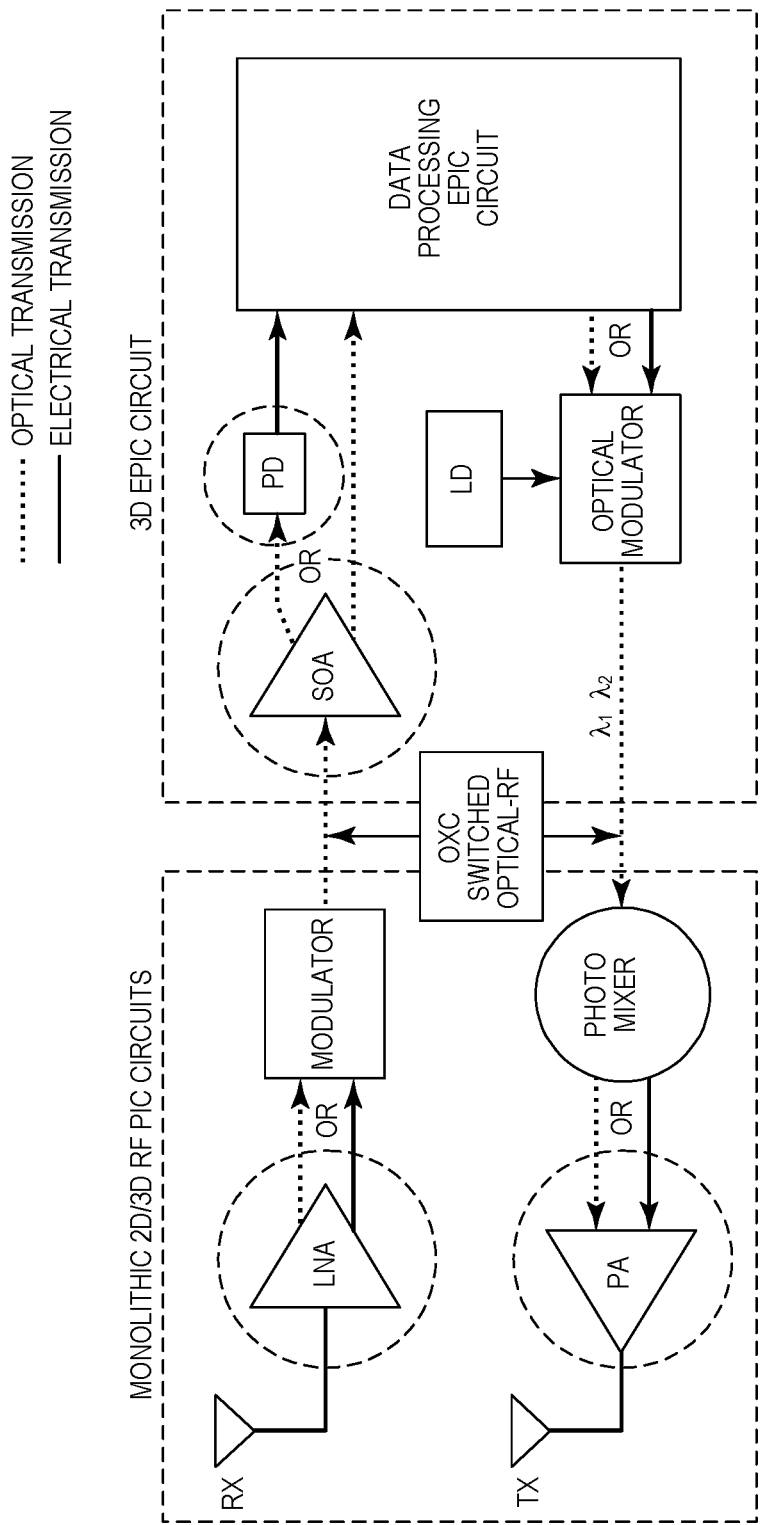
FIG. 2 is a schematic diagram illustrating an example RF 3D EPIC where the RF transceiver uses dedicated receive (RX) and transmit (TX) antennas.

FIG. 2 shows the schematic of an example RF 3D EPIC which is both full-duplex and half-duplex capable, controlled by an OXC switch. In various embodiments, this RF 3D EPIC compatible with either Frequency Division Duplex (FDD) or Time Division Duplex (TDD) communication schemes. The OXC switching functionality provides a cross-connect to connect the O-RE functionality on the RF PIC to any of various data processing sources and sinks. The bold dashed lines between various components indicate optical transmission links, while the bold solid lines indicate electrical (including RF) transmission links. It will be appreciated that RF-to-optical and optical-to-RF conversion can take place at any of a variety of places, in various embodiments—thus, the duplicated connections between some of the blocks in FIG. 2 indicate interfaces that may use either electrical or optical transmission (or both).

In the embodiment shown in FIG. 2, the receiver (Rx) and transmitter (Tx) circuits use different antennas. These may be referred to as a receive antenna and transmitter antenna, respectively, but it will be appreciated that these labels for the antennas do not indicate any particular structure for the antenna itself, but simply indicate that the respective antennas are connected to a transmitter circuit or a receiver circuit.

Figure 3:
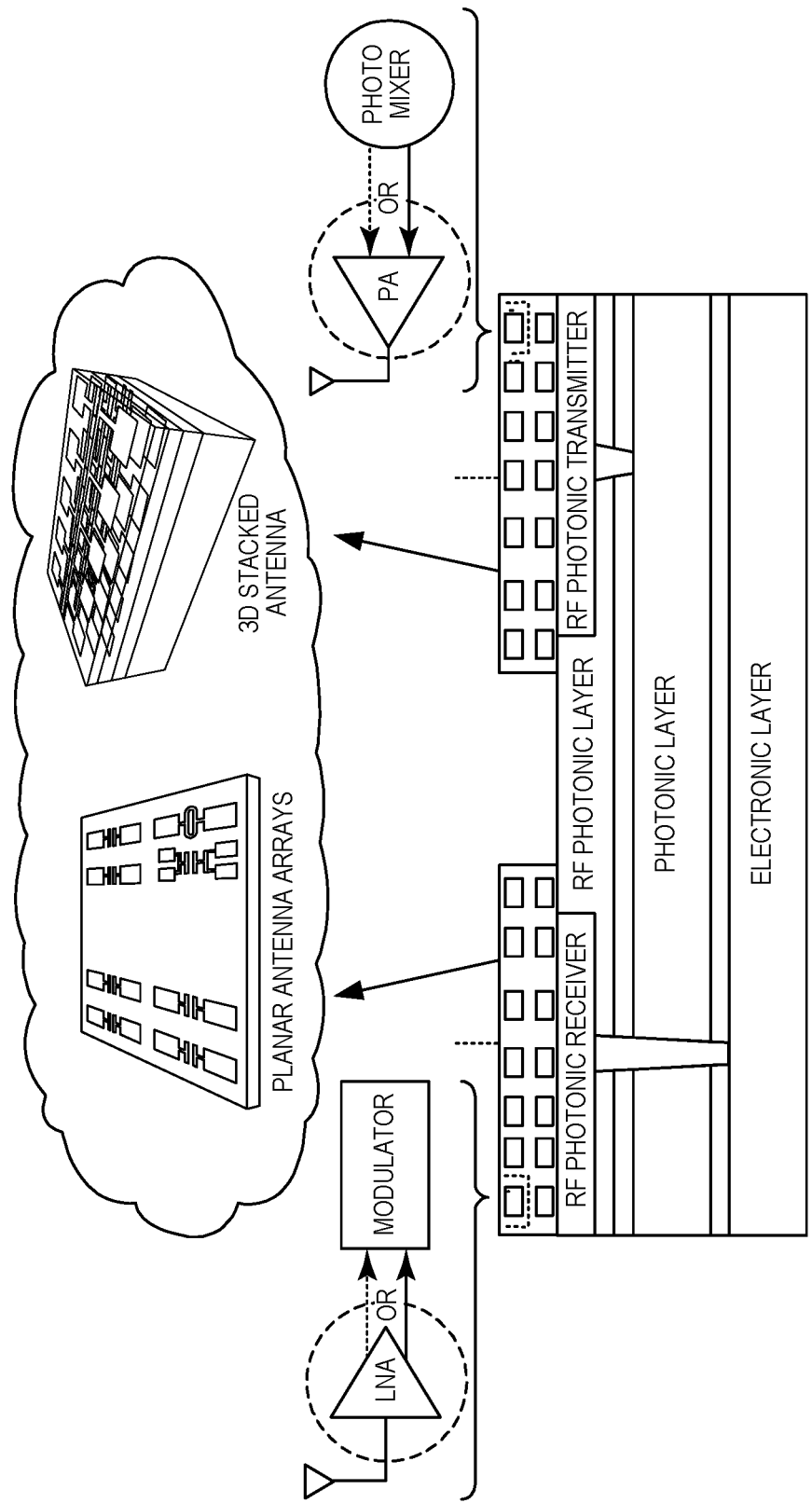
FIG. 3 illustrates a cross-section of an example RF 3D EPIC, using separate antennas stacked on top of the chip.

In the embodiment shown in FIG. 2, the antenna-coupled RF modulator 2D/3D PICs shown on the left side of the figure are in charge of the RF/optical signal conversions closest to the antenna interfaces. The RF 3D EPIC circuits, which may be physically below the RF PIC layer in a RF 3D EPIC, e.g., as shown in FIG. 3, process the optical signals from/to the RF PIC layer and external electrical/optical data signals.

In the receiver (Rx) circuit in the RF PIC shown in FIG. 2, the received RF signal from the antenna is converted into an optical signal by an electro-absorption modulator (EAM) in the RF PIC layer and transmitted to other components in the RF 3D EPIC. The RF signal collected can first be amplified by a low-noise amplifier (LNA), in some embodiments, and the optical signal from the EAM can also be amplified by a semiconductor optical amplifier (SOA). The circled outline of the LNA and SOA indicates these elements are optional and they are not necessary if the signal intensity is high enough. Similarly, the photon dectector (PD) is also optional and it is only needed when the optical signal is required to be converted into an electrical signal in the RF 3D EPIC.

In the transmitter (TX) circuit in the RF PIC shown in FIG. 2, the photo mixer and power amplifer (PA) are directly integrated with the RF PIC layer, to reduce electrical interconnections. The PA is optional, and is only required when the signal produced by the photo mixer is too low. The RF generation mechanism used is the (1) optical heterodyne of two slightly different wavelength laser diodes (LDs); (2) single pulsed LD generating optical pulses spaced by the inverse of the repetition rate with that generated on the photomixer, e.g. photodiode. (See Carpintero, G., et al., *Photonic Integrated Circuits for Radio-Frequency Signal Generation*, Journal of Lightwave Technology, 2016, 34(2): p. 508-515.) These laser beams will be partly or completely modulated by the optical or electrical signal from the data processing function of the RF 3D EPIC module before being sent to the photomixer. The optical signal transmission between the RF PIC layer and 3D-EPIC will be accomplished using different optical interconnections, like an optical TSV or fiber. Besides amplification, newer generations of LNAs and PAs can also perform the function of E/O and O/E convertion, so various embodiments amplifiers can emit or collect both electrical and optical signals, as shown in FIG. 2.

In order to optimize the functions of the elements in the RF PIC layer, different materials specifically for the EAM photomixer and antennnas (e.g., quantum dot, graphene, carbon nanotube)(Lin, Xin et al. 2009, Chernysheva, Mou et al. 2016) (Perruisseau-Carrier, Tamagnone et al. 2013) can be selectively grown on a stacked microstructure. (See Habibpour, O., et al., *Wafer scale millimeter-wave integrated circuits based on epitaxial graphene in high data rate communication*, Scientific Reports, 2017, 7: p. 41828.) Single materials (e.g., tunable quantum dot or graphene) that are efficient in both E/O and O/E conversion can be grown instead of deposition of different materials for the EAM and photomixer. Different materials can also be deposited for the active and passive components in the RF 3D EPIC. All of these procedures can be acomplished in a standard foundary.

Figure 4:
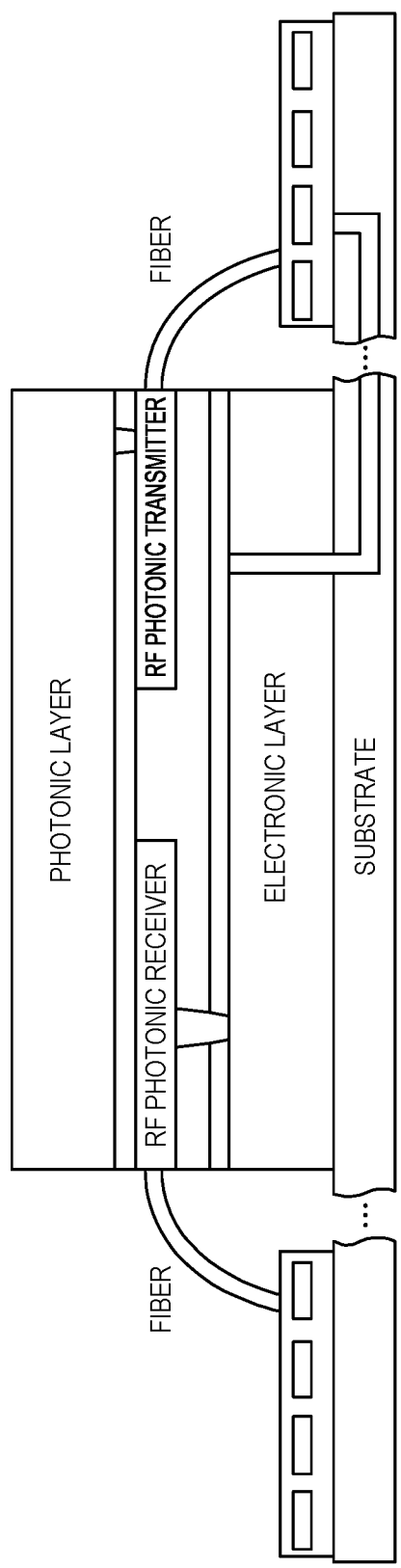
FIG. 4 illustrates a cross-section of another example RF 3D EPIC, using remote antennas on a substrate/carrier.

Depending on how the antenna-coupled RF PIC layers are integrated with the 3D-EPIC, the chip microstructure can be different. This is seen in FIG. 3 and FIG. 4. In FIG. 3, the antenna-coupled RF PIC layer is directly grown on top of the 3D EPIC stacks. In the Rx circuitry, the modulated light in the RF PIC layer can be transmitted to the 3D EPIC layers through vertical optical interconnections.

Figure 6:
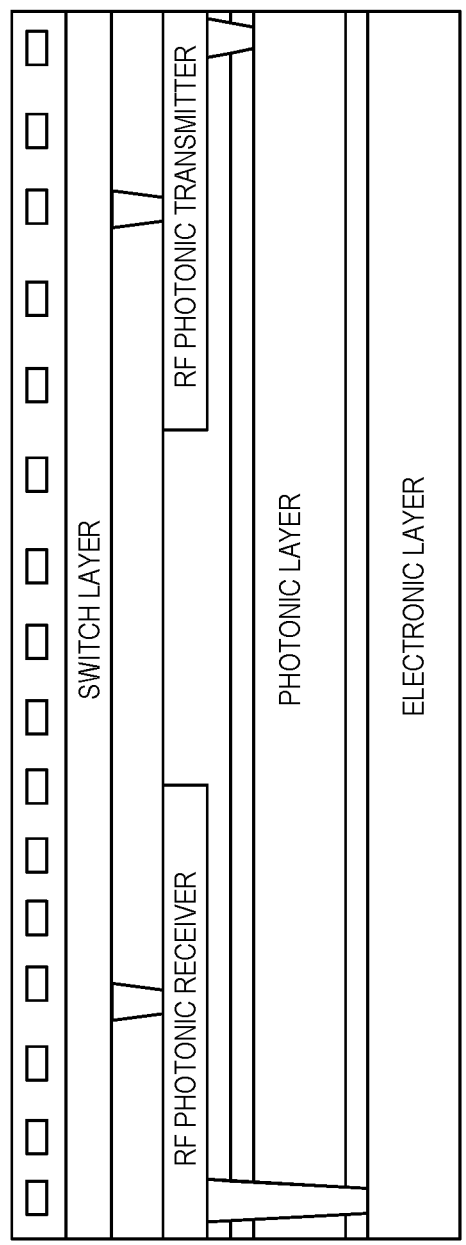
FIG. 6 is a cross-section of an example RF 3D EPIC where the RF transceiver uses the same antenna for transmitting and receiving.

AOC technology provides for various antenna designs, like dipole antenna, bow-tie antenna, Yagi-Uda antenna, nano-antenna and so on. Two or more patched antennas can be connected into the same electrode, in some embodiments, to enhance the RF electrical signal. The planar antenna can be stacked on each other into a 3D multilayer high-gain antenna system using AMC or micromachined polymer spacers. (See Pavuluri, S. K., C. Wang, and A. J. Sangster, *High efficiency wideband aperture-coupled stacked patch antennas assembled using millimeter thick micromachined polymer structures*, IEEE Transactions on Antennas and Propagation, 2010, 58(11): p. 3616-3621.) In FIG. 3, the black box in the dotted rectangle outline, embedded on top of the stacked layers, contains AOC, modulator (e.g. EAM), and LNA in the Rx circuit, while in the Tx circuit, it includes an AOC, PA and photo-mixer. Note that the photo-mixer could simply be a photodiode, in some embodiments, while the PA may be a transimpedance amplifier. The black boxes in FIG. 4 and FIG. 6 are the same as in FIG. 3.

Standard bottom cooling systems can be used to cool the 3D chip. To minimize the RF cross-talk between the Tx and Rx elements, the Tx and Rx can use a different polarization AOC, or use FDD/TDD communication conventions. Passive isolation technology can be used to reduce the electromagnetic coupling between transmitter and receiver antenna.

As an alternative to or in addition to being directly stacked on top of the 3D EPIC chip layers, as shown in FIG. 3, the antenna-coupled RF PIC layers can be installed on the free area of the substrate on which the 3D EPIC chip is installed. This approach may provide a larger area for antenna areas. The substrate can be a standard printed-circuit board (PCB), an optical PCB, or a semiconductor wafer substrate, in various embodiments.

An example of this approach is shown in FIG. 4. The antenna-coupled RF PIC layers can also be in 2D or 3D, e.g., as discussed in connection with FIG. 3. Note that when the RF PIC layers are not stacked on top of the 3D EPIC chip layers, the RF photonic transmitter and RF photonic receiver layers that interface with the RF PIC layers can be stacked on top of the 3D-EPIC or inside of the 3D-EPIC. The latter approach is shown in FIG. 4.

Besides a bottom-side cooling system, this design is compatible with a top-side cooling system and microfluidic liquid cooling system. Fiber, optical waveguide, and other optical interconnection methods are used to transport optical signals between the antenna-coupled RF PIC layer and integrated Rx and Tx layers in the 3D EPIC chip.

Figure 5:
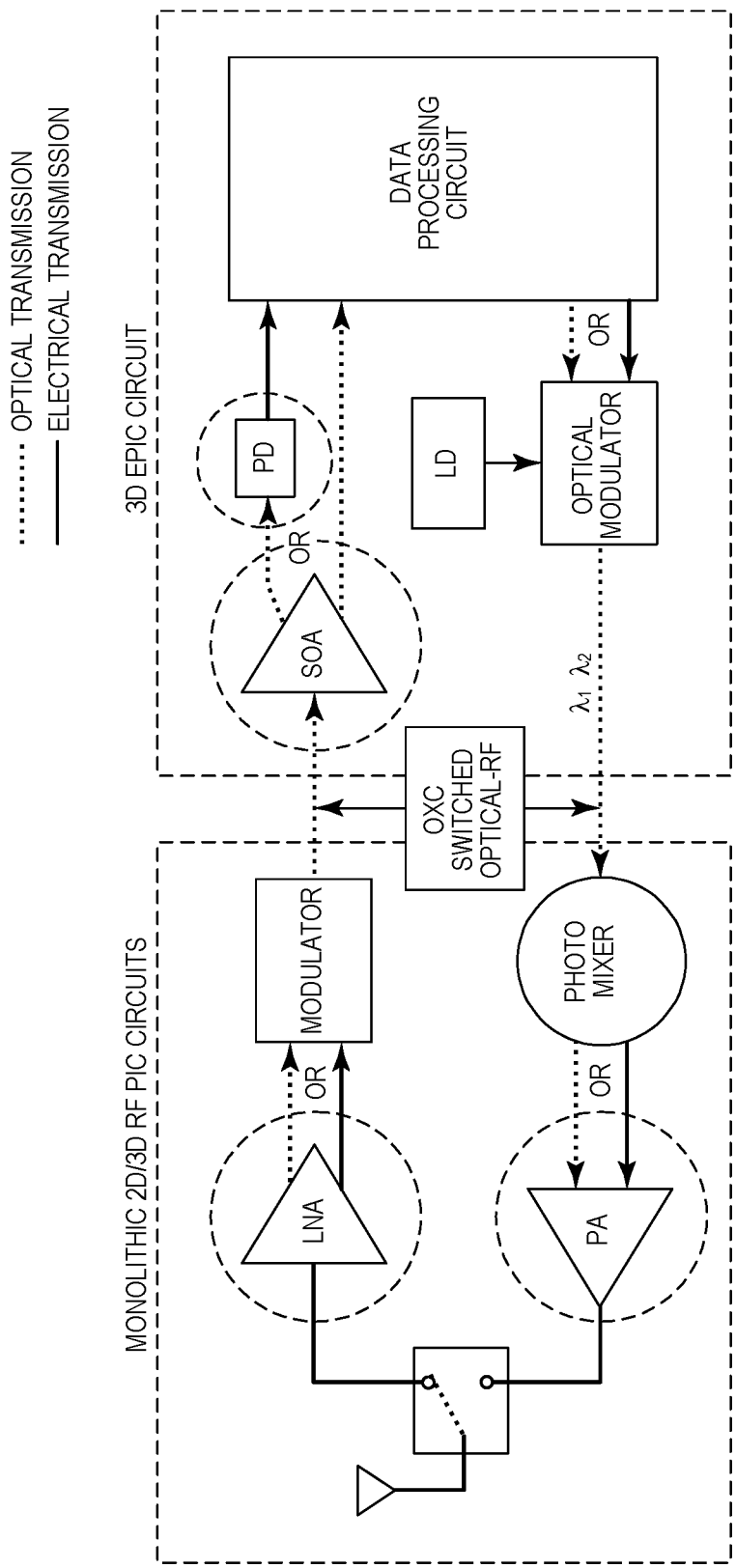
FIG. 5 is a schematic diagram illustrating an example RF 3D EPIC where the RF transceiver uses the same antenna for transmitting and receiving.

In a variation of the design shown generally in FIG. 2, Rx and Tx circuits share the same antenna arrays. In this case, the antennas may be referred to as Rx/TX antennas. An RF photonic switch can be used to switch the O-RE transmission line in the up and down links of the RF-3D-PIC circuits, as shown in FIG. 5. An example of such a switch is described in Brown, E. R., *RF-MEMS switches for reconfigurable integrated circuits*, IEEE Transactions on Microwave Theory and Techniques, 1998, 46(11): p. 1868-1880. The O-RE signal will be processed in the RF photonics circuits and 3D-EPIC chips, in a similar manner as discussed above in connection with FIG. 3.

FIG. 6 shows the cross section of an example RF 3D EPIC using the same AOC controlled by the RF and OXC switch embedded in the chip, to support half-duplex, i.e., TDD communications. Chip-scale photonic switches, such as an RF photonic crystal switch, a metal-oxide-Si field effect plasmonic modulator switch, etc., can be used. (See Dionne, J. A., et al., *PlasMOStor: A Metal-Oxide-Si Field Effect Plasmonic Modulator*, Nano Letters, 2009, 9(2): p. 897-902.) The photonic switch layer can be deposited between RF PIC layer and 3D-EPIC chips, in some embodiments.

As discussed above in connection with FIG. 3, various AOC can be stacked on top of the chip. Alternatively, the antenna-coupled RF layer can be installed in a free area on a substrate, and optically interconnected to the RF 3D EPIC chip as discussed in connection with FIG. 4.

The OXC switch complex can function in either or both of a time-division and space-division switching capacity. The OXC enables the RF 3D EPIC to perform antenna beam-forming by transmitting/receiving O-RE signals to/from a select group of antennas. Also, the OXC switch enables the virtualization of several RF wireless access points on a single RF 3D EPIC, by optically switching different O-RE spectrum concurrently to/from designated groups of antennas. Lastly, the OXC provides transceiver resiliency in the event of a single element failure, which can be replaced in a segmented RF 3D EPIC.

In view of the detailed examples shown in the attached figures and described above, it will be appreciated that embodiments of the various circuit assemblies disclosed herein include a radio-frequency three-dimensional electronic-photonic integrated circuit (RF 3D EPIC), which comprises a radio-frequency (RF) photonic integrated circuit (PIC) layer, the RF PIC layer comprising, in a single integrated circuit, at least one RF antenna and at least one photonic device coupling the RF antenna to an optical interface, and which further comprises an electronic-photonic integrated circuit (EPIC) assembly optically coupled to the optical interface of the RF PIC layer, the EPIC assembly comprising two or more integrated-circuit dies bonded to one another so as to form a die stack, wherein at least one of the two or more integrated-circuit dies comprises one or more integrated photonic devices and wherein each of the two or more integrated-circuit dies is electrically connected to at least one other integrated-circuit die via an electrically conductive through-wafer interconnect or an electrically conductive through-wafer via.

In some embodiments, the RF PIC layer is in a stack that comprises the RF PIC layer and the EPIC assembly, e.g., as shown in FIG. 3. In some embodiments, the circuit assembly further comprises a substrate to which the EPIC assembly and the RF PIC layer are separately bonded, the circuit assembly further comprising an optical fiber or waveguide coupling the optical interface of the RF PIC to the EPIC, e.g., as shown in FIG. 4.

In some embodiments, the EPIC assembly is optically coupled to the RF PIC layer via an OXC switch. In some embodiments, this OXC switch is formed in a physical layer bonded to the two or more integrated-circuit dies of the die stack and is coupled to at least one of the one or more integrated photonic devices via a photonic interconnect. In some of these latter embodiments, the RF PIC layer is bonded to the physical layer comprising the OXC switch. In some embodiments, the EPIC assembly comprises a semiconductor optical amplifier (SOA) configured to amplify an optical signal received from the RF PIC via the optical interface.

In some embodiments, the at least one RF antenna of the circuit assembly includes a receive antenna that is coupled to an electro-absorption modulator (EAM) configured to convert RF signals received via the receive antenna to an optical signal for coupling to the optical interface. In some embodiments, the receive antenna of the RF PIC is coupled to the EAM via an RF low-noise amplifier. Likewise, some embodiments include a transmit antenna that is coupled to an output of a photo-mixer configured to convert RF signals received via the optical interface to an RF signal for transmission via the transmit antenna. In some of these embodiments, the transmit antenna is coupled to the output of the photo-mixer via an RF power amplifier.

In some embodiments, the at least one RF antenna of the circuit assembly includes a transmit/receive antenna that is coupled to both (a) an EAM configured to convert RF signals received via the transmit/receive antenna to an optical signal for coupling to the optical interface and (b) to an output of a photo-mixer configured to convert RF signals received via the optical interface to an RF signal for transmission via the transmit/receive antenna. The transmit/receive antenna may be coupled to both the EAM and the output of the photo-mixer via an RF switch, in some embodiments. In some embodiments, the RF PIC layer comprises a plurality of RF antennas, each of the plurality of RF antennas being coupled to a corresponding EAM or photo-mixer or both.

It will be appreciated that the above description and the claims appended hereto comprehend methods and devices that vary from the examples specifically illustrated in the attached figures. In particular, it will be appreciated that features from any one of the examples described above may be combined with features from other examples, unless the description or attendant details indicate otherwise. Accordingly, the inventive techniques and devices disclosed herein are not limited to any one or several ones of the specifically described or illustrated examples.

What is claimed is:

1. A circuit assembly, comprising:
    a radio-frequency (RF) photonic integrated circuit (PIC) layer, the RF PIC layer comprising, in a single integrated circuit, at least one RF antenna and at least one photonic device coupling the RF antenna to an optical interface; and
    an electronic-photonic integrated circuit (EPIC) assembly optically coupled to the optical interface of the RF PIC layer, the EPIC assembly comprising two or more integrated-circuit dies bonded to one another so as to form a die stack, wherein at least one of the two or more integrated-circuit dies comprises one or more integrated photonic devices and wherein each of the two or more integrated-circuit dies is electrically connected to at least one other integrated-circuit die via an electrically conductive through-wafer interconnect or an electrically conductive through-wafer via.

2. The circuit assembly of claim 1, wherein the RF PIC layer is in a stack that comprises the RF PIC layer and the EPIC assembly.

3. The circuit assembly of claim 1, wherein the EPIC assembly is optically coupled to the RF PIC layer via an optical cross-connect (OXC) switch.

4. The circuit assembly of claim 3, wherein the OXC switch is formed in a physical layer bonded to the two or more integrated-circuit dies of the die stack and is coupled to at least one of the one or more integrated photonic devices via a photonic interconnect.

5. The circuit assembly of claim 4, wherein the RF PIC layer is bonded to the physical layer comprising the OXC switch.

6. The circuit assembly of claim 1, wherein the circuit assembly further comprises a substrate to which the EPIC assembly and the RF PIC layer are separately bonded, the circuit assembly further comprising an optical fiber or waveguide coupling the optical interface of the RF PIC to the EPIC.

7. The circuit assembly of claim 1, wherein the at least one RF antenna includes a receive antenna that is coupled to an electro-absorption modulator (EAM) configured to convert RF signals received via the receive antenna to an optical signal for coupling to the optical interface.

8. The circuit assembly of claim 7, wherein the receive antenna of the RF PIC is coupled to the EAM via an RF low-noise amplifier.

9. The circuit assembly of claim 1, wherein the at least one RF antenna includes a transmit antenna that is coupled to an output of a photo-mixer configured to convert RF signals received via the optical interface to an RF signal for transmission via the transmit antenna.

10. The circuit assembly of claim 9, wherein the transmit antenna is coupled to the output of the photo-mixer via an RF power amplifier.

11. The circuit assembly of claim 1, wherein the at least one RF antenna includes a transmit/receive antenna that is coupled to both (a) an electro-absorption modulator (EAM) configured to convert RF signals received via the transmit/receive antenna to an optical signal for coupling to the optical interface and (b) to an output of a photo-mixer configured to convert RF signals received via the optical interface to an RF signal for transmission via the transmit/receive antenna.

12. The circuit assembly of claim 11, wherein the transmit/receive antenna is coupled to both the EAM and the output of the photo-mixer via an RF switch.

13. The circuit assembly of claim 1, wherein the EPIC assembly comprises a semiconductor optical amplifier (SOA) configured to amplify an optical signal received from the RF PIC via the optical interface.

14. The circuit assembly of claim 1, wherein the RF PIC layer comprises a plurality of RF antennas, each of the plurality of RF antennas being coupled to a corresponding EAM or photo-mixer or both.

* * * * *